US010311495B2

(12) United States Patent
Kolton

(10) Patent No.: US 10,311,495 B2
(45) Date of Patent: Jun. 4, 2019

(54) CUSTOMIZABLE PRODUCT HOUSING

(71) Applicant: Timothy Val Kolton, Arlington, TX (US)

(72) Inventor: Timothy Val Kolton, Arlington, TX (US)

( * ) Notice: Subject to any disclaimer, the term of this patent is extended or adjusted under 35 U.S.C. 154(b) by 739 days.

(21) Appl. No.: 14/740,107

(22) Filed: Jun. 15, 2015

(65) Prior Publication Data

US 2016/0366775 A1    Dec. 15, 2016

(51) Int. Cl.
*H04R 1/02*      (2006.01)
*G06Q 30/06*    (2012.01)
*H05K 11/00*    (2006.01)

(52) U.S. Cl.
CPC ........... *G06Q 30/0621* (2013.01); *H04R 1/02* (2013.01); *H05K 11/00* (2013.01); *H04R 2201/02* (2013.01)

(58) Field of Classification Search
CPC ............................... H04R 2420/07; H04R 1/02
See application file for complete search history.

(56) References Cited

U.S. PATENT DOCUMENTS

| | | | | |
|---|---|---|---|---|
| 2,896,737 A * | 7/1959 | Gellman | .............. | H04R 1/2888 181/153 |
| 4,580,654 A * | 4/1986 | Hale | ......................... | H04R 1/02 181/146 |
| 5,771,302 A * | 6/1998 | Schindler | ............... | H04R 31/00 181/199 |
| 6,064,746 A * | 5/2000 | Nakamura | ............. | H04R 17/00 310/324 |
| 6,859,543 B2 * | 2/2005 | Fingleton | ............... | H04R 1/323 181/153 |
| 6,983,130 B2 * | 1/2006 | Chien | ...................... | H04M 1/18 379/433.01 |
| 7,605,862 B2 * | 10/2009 | Hou | ...................... | H04R 1/2803 348/373 |
| 8,666,107 B2 * | 3/2014 | Tzeng | ...................... | H04R 1/02 381/387 |
| 9,462,361 B2 * | 10/2016 | Amae | ...................... | H04R 1/02 |
| 9,641,921 B2 * | 5/2017 | Garfio | ...................... | H04R 1/02 |
| 9,883,265 B2 * | 1/2018 | Cheney | ..................... | H04R 1/02 |
| 9,888,305 B2 * | 2/2018 | Prommersberger | ... | H04R 1/026 |

(Continued)

FOREIGN PATENT DOCUMENTS

JP            55125793 A1 * 9/1980

*Primary Examiner* — Jesse A Elbin
*Assistant Examiner* — Ryan Robinson
(74) *Attorney, Agent, or Firm* — Edwin Tarver

(57) ABSTRACT

A personalized housing for a consumer product, such as a speaker, includes a customizable cover at least partially covering the product and a set of at least two end caps coupled to the product. The end caps are oriented in at least partial opposition to each other and installed using an interference fit. A vibration dampening connector or buffer couples the end caps to the product. The buffer is arranged such that urging the end caps onto the product couples the end caps in a releasable interference fit, and the cover remains coupled to the product when the end caps are pulled from the cover. The cover allows access to controls located on the product, for example volume and input controls, may be made of a front panel covering only the front of the product, and a corresponding enclosure that covers the top, rear and sides of the product.

4 Claims, 15 Drawing Sheets

(56) References Cited

U.S. PATENT DOCUMENTS

2009/0139990 A1* 6/2009 Bailis ................... A45C 7/0031
220/212
2013/0306399 A1* 11/2013 Swan ..................... H04R 1/026
181/199

* cited by examiner

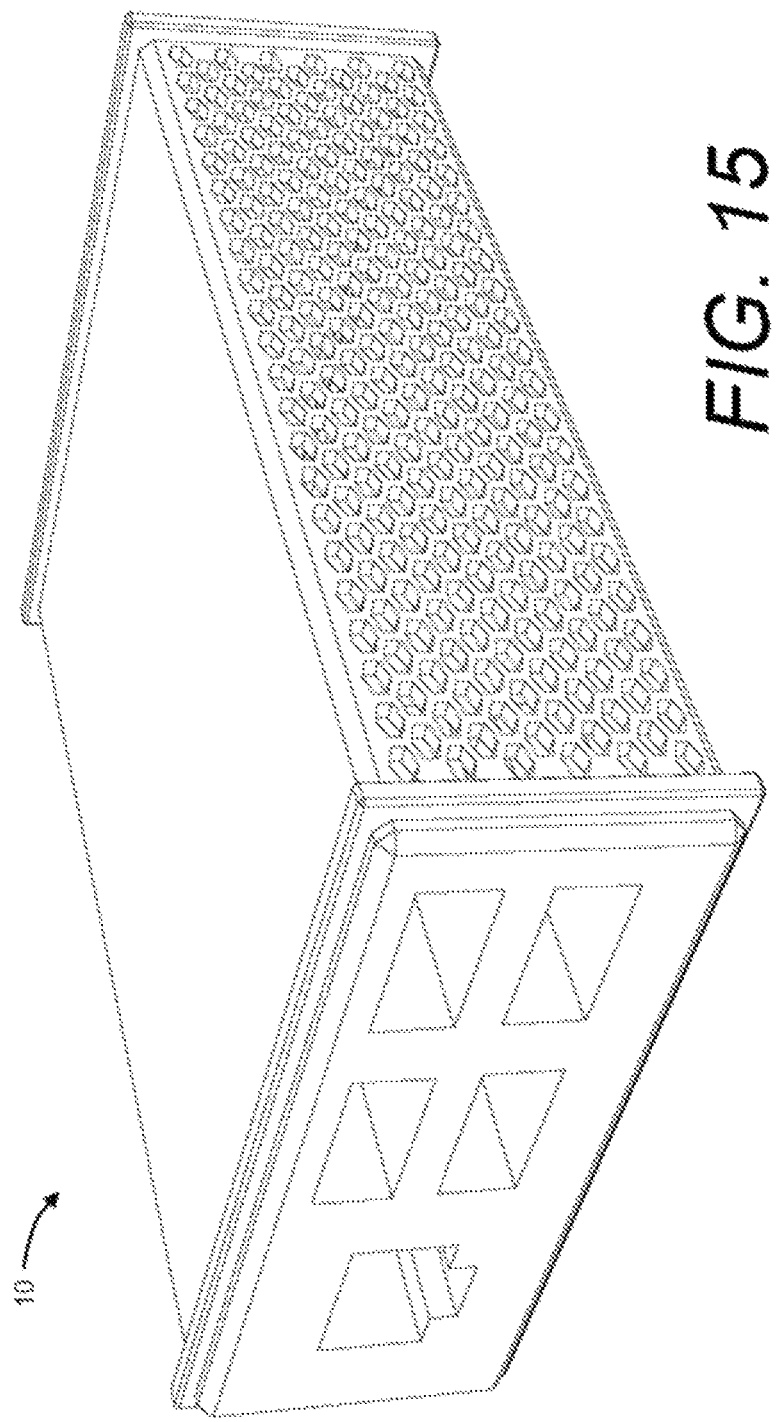

CUSTOMIZABLE PRODUCT HOUSING

BACKGROUND

Field of the Invention

The present invention generally relates to personal electronics. More specifically, the present invention relates to a customizable housing for personal electronics Related Art Personal electronics, such as portable stereos, computer equipment and the like are commonplace. One popular category of personal electronics is portable speakers that can be linked to an audio source, such as a cell phone, tablet computer, or similar device for playing music files. Like cell phones and tablets, design is a crucial feature consumers turn to for portable speakers and similar electronics. Although design characteristics drive sales to a large extent, the ability to provide only one industrial design for these products remains limiting.

Three dimensional (3D) printing techniques have been developed as a way to create a variety of consumer products based on 3D design technology. While originally a novelty, improvements in 3D printing technology have enabled manufacturers to offer 3D printed designs on the commercial market on a large scale. One popular business model for all technology is to provide a user interface via a website or similar interactive feature allowing users to create their own designs based on a field of predetermined parameters, and have those designs 3D printed and delivered to the user. Currently customized 3D printed goods are presently limited to jewelry or other small items that are customized in their entirety and have few or no operational components.

Hence, what is needed is a customizable, user designed, 3D or similarly manufactured housing to provide user customization in the field of consumer electronics. An object of the present invention is therefore to allow consumer electronics, such as speakers, to be conventionally mass produced, while permitting users to create individual designs for such consumer electronics. Another object of the invention is to provide a customized housing for consumer electronics, that can be quickly and easily removed and replaced with an alternate housing design. Another object of the invention is to allow users to customize and create several different housing designs that can be quickly and easily replaced according to user preference. Another object of the invention is to provide pre-made designs that may be combined with custom designs to provide greater choice in customizing user electronics. Another object of the invention is to provide a customized housing for a personal speaker, that provides excellent sound isolation and dampening features to enhance sound quality.

These and other objects of the invention are more fully discussed in the following specification and illustrations.

SUMMARY

A personalized housing for a consumer product having operational components includes a customizable cover at least partially covering the product. A set of at least two end caps are coupled to the product. The end caps are oriented in at least partial opposition to each other and an interference fit vibration dampening connector or buffer couples the end caps to the product. The end caps may also be coupled to the product by being coupled solely to the cover, which at least partially covers the product. The buffer is arranged such that urging the end caps onto the product couples the end caps to the product in a releasable interference fit, and the cover may remain coupled to the product when the end caps are decoupled from the cover.

The housing is designed to cover a product having exterior walls, or that is encased within a housing of its own, but in one embodiment, the product may comprise only internal components, and the housing formed by the cover and end caps will be the only housing around the components. The cover preferably allows access to controls located on the product, for example volume and input controls, etc. The cover may also be made of a front panel that covers only the front of the product, and a corresponding enclosure that covers the top, rear and sides of the product. To assist with assembling the cover, a registration feature may be included for positioning the cover relative to the product.

Preferably, the cover will include as recess for seating the buffer. The recess may be a groove incorporated into the cover, or a channel incorporated into the end cap. The end cap includes a cavity for receiving the product, thereby enclosing the ends of the product, including the cover. Because the end cap encloses the cover and the product, the end cap or end caps, when installed over the cover, elevate the cover and product above a resting surface, including a flat resting surface. The end caps preferably include a recess or recessed area in which the cover seats. In instances where the buffer is located on the cover, such as on the front panel and enclosure, the end caps preferably include a channel in which the buffer seats.

The end caps may include supports for elevating the product above a surface, including supports for vibration dampening. The end caps may also include brackets for fixing the housing to a vertical surface, in such an instance, the end caps may hold the product at a predetermined angle according to preference. The buffer is preferably deformable yet resilient, and may be made of a resilient band, such as a rubber or silicon band. Alternatively, the buffer may be a series of independent resiliently deformable structures. In any event, the buffer preferably prevents the end caps from touching the cover, thereby providing a vibration dampening effect.

In one embodiment, the customizable housing for a consumer product having operational components includes opposing end caps, each end cap having a cavity. A customizable cover is affixed to the product, and extends into the cavity of each end cap. The resilient interference lit vibration dampening buffer couples the end caps to the product and couples the end caps to the cover. The buffer prevents the end caps from contacting the product and prevents the end caps from contacting the cover once the end caps are urged onto the ends of the product. The cover preferably remains affixed to the product when the end caps are pulled from the product.

A method of customizing a product to have a user-defined ornamental housing includes several steps. First a computer-based interface is provided for defining a consumer-created design. A user engages the computer-based interface, designing a cover design for at least partially enclosing the product and designing a first end cap design for at least partially enclosing the cover. Based on the user's design, a cover is formed, as well as, or alternatively, an end cap based on the end cap design. The end caps and cover are provided to the user based on the user's end caps and cover design.

With the custom components of the housing in hand, the user aligns and places the cover on the product, coupling the cover to the product. The user then aligns and presses the end caps against the cover to couple the end caps to the cover, and operates the product as desired. The cover may be formed from a first piece and a second piece, and are preferably designed using a computer-based interface. The cover is provided based on the design formed using the computer-based interface. When the user wants to re-customize the housing, the user simply pulls the end caps from the cover and presses secondary end caps onto the cover, the secondary end caps having a secondary end cap design.

BRIEF DESCRIPTION OF THE FIGURES

FIG. 15 illustrates a perspective view of the USB hub housing.

DETAILED DESCRIPTION

The following description is presented to enable any person skilled in the art to make and use the invention, and is provided it the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

Figure 1:
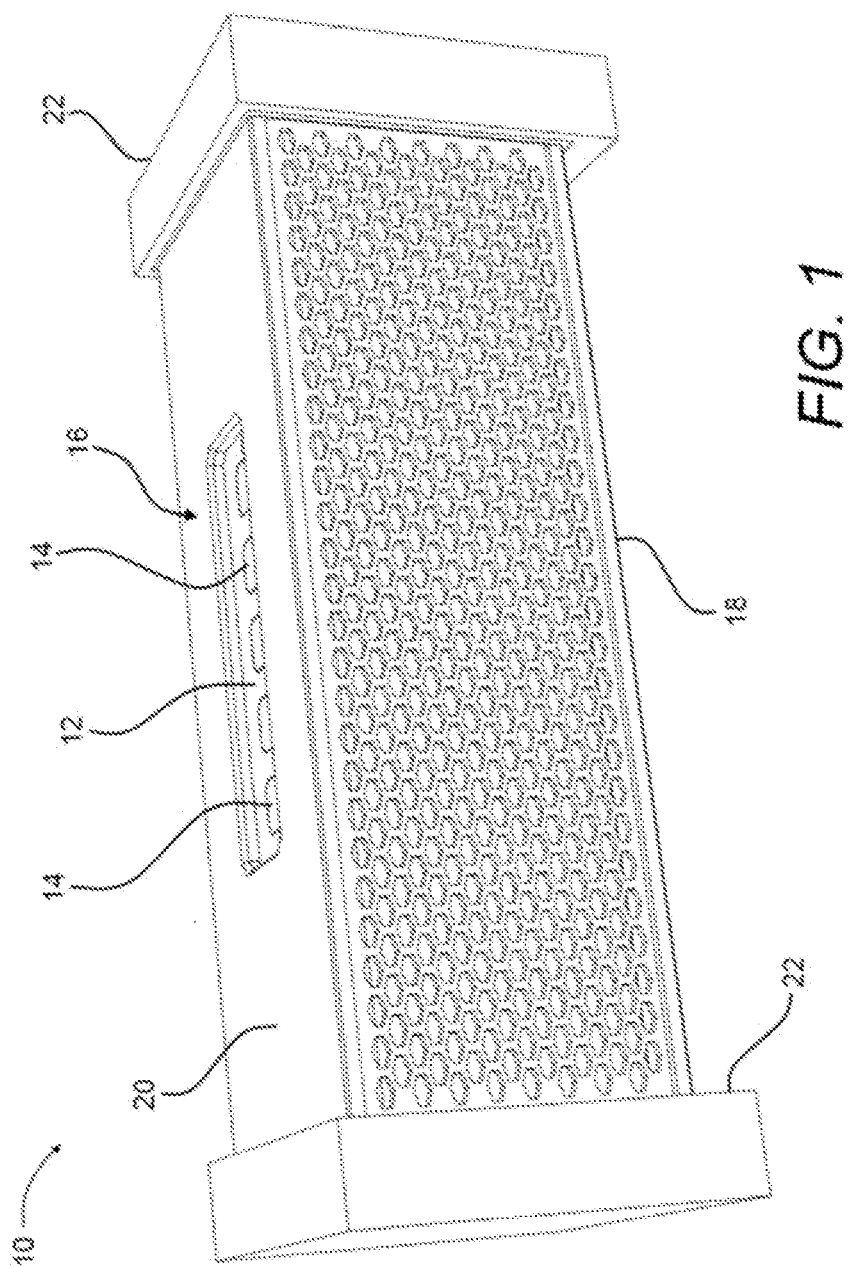
FIG. 1 illustrates a product having a customized housing in perspective view.

Referring to FIG. 1, a customizable, removable housing 10 is shown enclosing a product 12. Although the housing 10 virtually completely encloses the product 12, in the illustrated embodiment a portable speaker product 12, access to controls 14 of the product 12 is available through a top opening 16 incorporated into the housing 10. In the illustrated embodiment, the housing 10 includes a front panel 18 covering the front of the product 12, an enclosure 20 covering the top back and bottom of the product 12, and end caps 22 capping the ends of the product 12, and coupled to the front panel 18 and enclosure 20.

Figure 2:
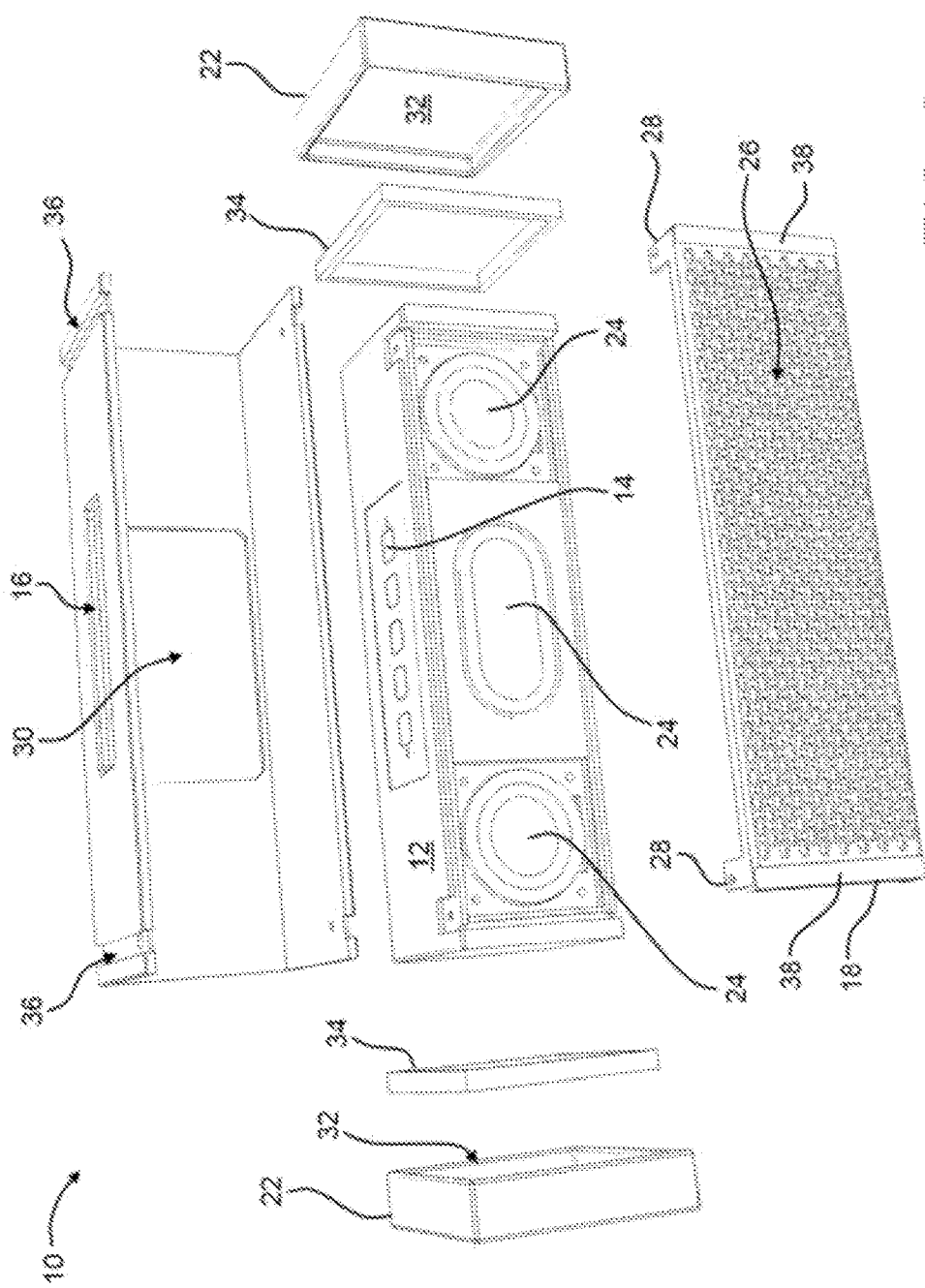
FIG. 2 illustrates an exploded view of the product and customized housing.

Referring to FIG. 2, the product 12 is preferably a wireless speaker. In addition to optional controls 14, it preferably includes cones 24 for sound production and other operational components (not shown). The front panel 18 preferably includes a mesh 26 to allow sound transmission through the housing 10, and to provide a decorative appearance. The front panel 18 may also include anchoring tabs 28, for aligning the front panel 18 with the product 12. In addition to the top opening 16, the enclosure 20 may include a rear opening 30 for accessing, additional areas of the product 12, such as a wired power supply or audio jack (not shown).

Still referring to FIG. 2, the end caps 22 preferably include a recessed area into which the product 12, front panel 18, and enclosure 20 seat. Because they are larger in circumference than the product 12, front panel 18, and enclosure 20, the housing 10 ideally rests on the end caps 22 when placed on a planar surface (not shown). The end caps 22 are coupled to the front panel 18 and enclosure 20 using a connector 34. Preferably, the connector 34 is a deformable resilient material, such as silicon or rubber, to provide a vibration dampening effect between the product 12 and the end caps 22. In the illustrated embodiment the connectors 34 are rings of material that surround the front panel 18 and the enclosure 20. To ensure proper installation, each connector 34 may seat in a groove 36 on the enclosure and a corresponding depression 38 on the front panel 18.

Figure 3:
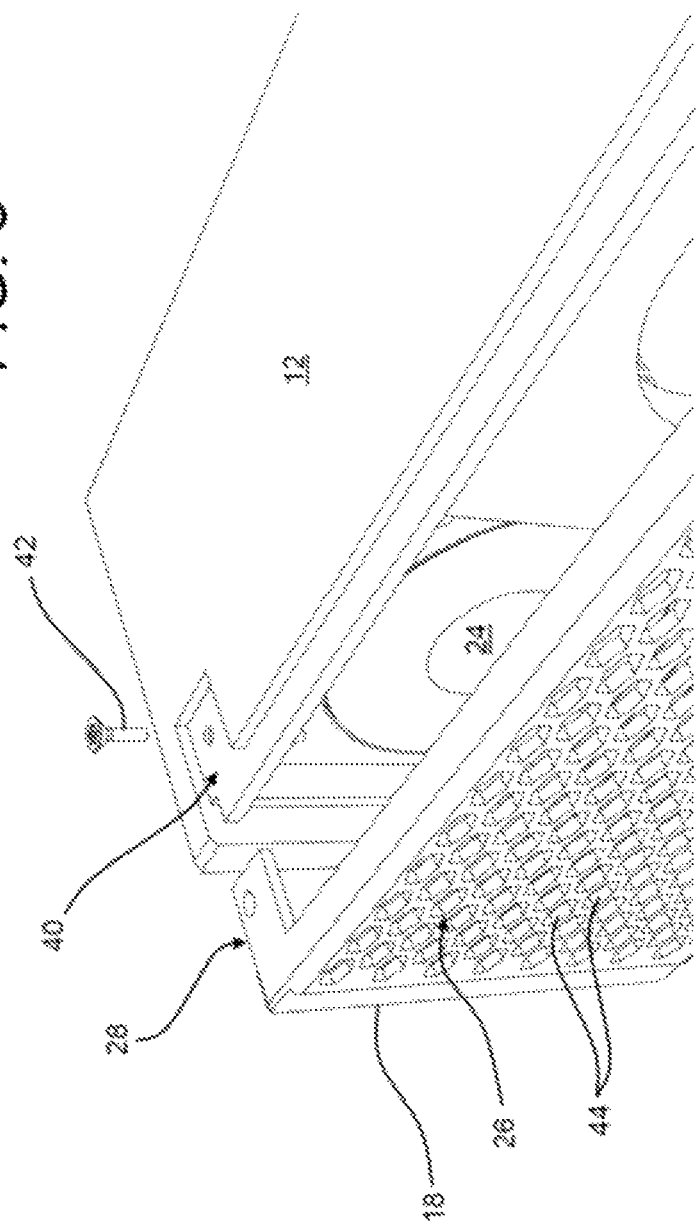
FIG. 3 illustrates an enlarged exploded view of the left side of the product with a first portion of the housing and a fastener.

Referring to FIG. 3, in one embodiment, the front panel 18 includes an anchoring tab 28 for aligning with the product 12. The product 12 may include a corresponding anchoring groove 40 into which the anchoring tab 28 seats to provide a smooth profile The anchoring tab 28 may be affixed to the product 12 using a fastener 42, such as a threaded screw. Also shown in FIG. 2, the mesh 26 of the front panel 18 is preferably made in a predetermined, customized pattern, such as hexagonal openings 44 to provide an attractive appearance to the front panel 18. Because the housing 10 is customizable by a user, the front panel 18 mesh 26 may be made in virtually any pattern according to user preference.

Figure 4:
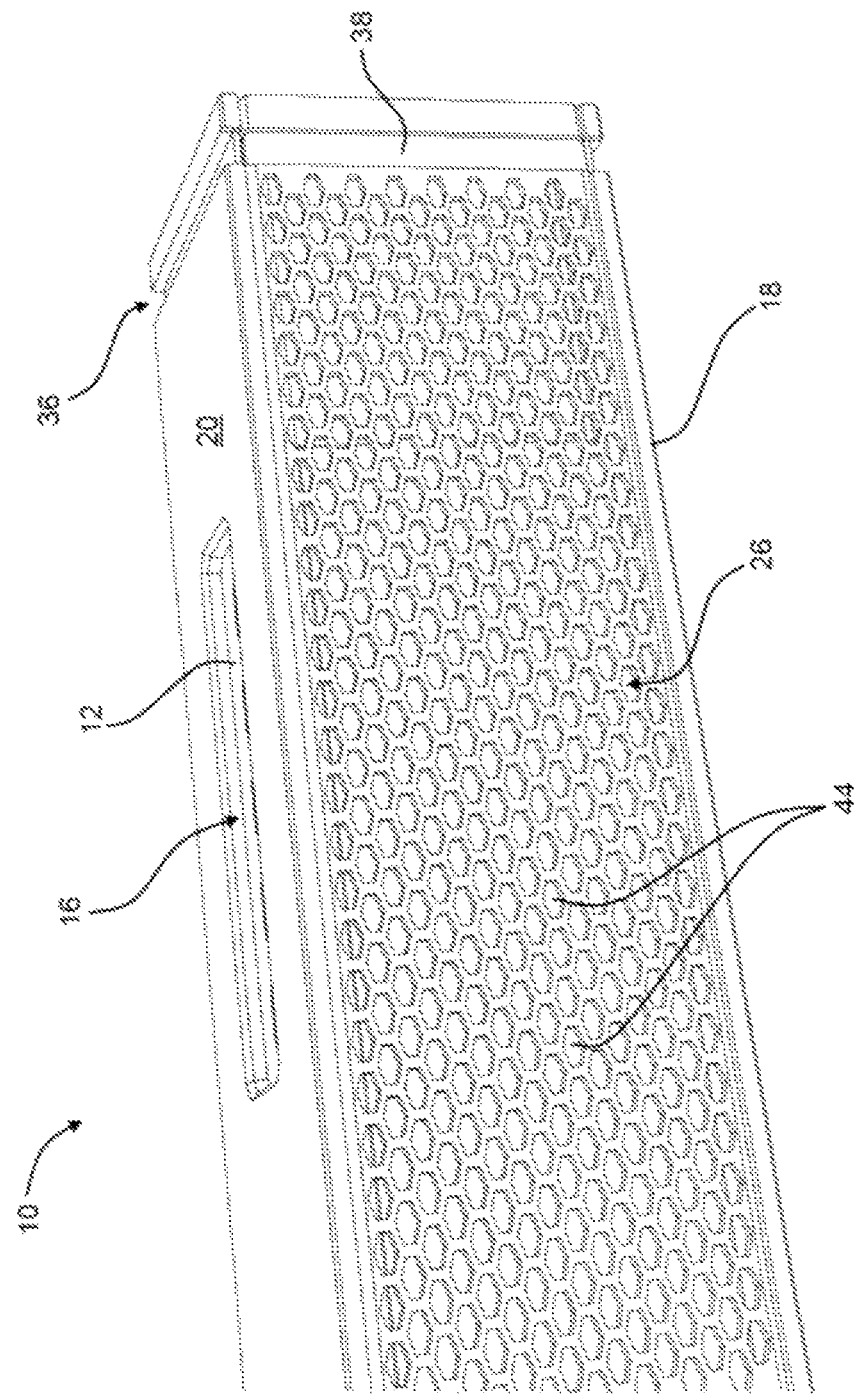
FIG. 4 illustrates a perspective view of the right side of the product with the first portion and a second portion of the housing installed thereon.

Referring to FIG. 4, when the front panel 18 is installed against the product 12 and the enclosure 20 brought over the product 12 and front panel 18, the groove 36 and depression 38 serve to anchor the connector 34 (not shown) in position. While the connector 34 may be a standalone o-ring as shown in FIG. 2, it may also be incorporated into the end caps 22 according to preference, thereby allowing causing the end caps 22 to seat in the groove 36 and depression 38 and remain there under a pressure fit. In another embodiment, the fastener 42 (not shown) may be driven through the enclosure 20 as well as the front panel 18 and product 12, thereby fastening the front panel 18 and enclosure 20 onto the product 12 regardless of placement of the end caps 22.

Figure 5:
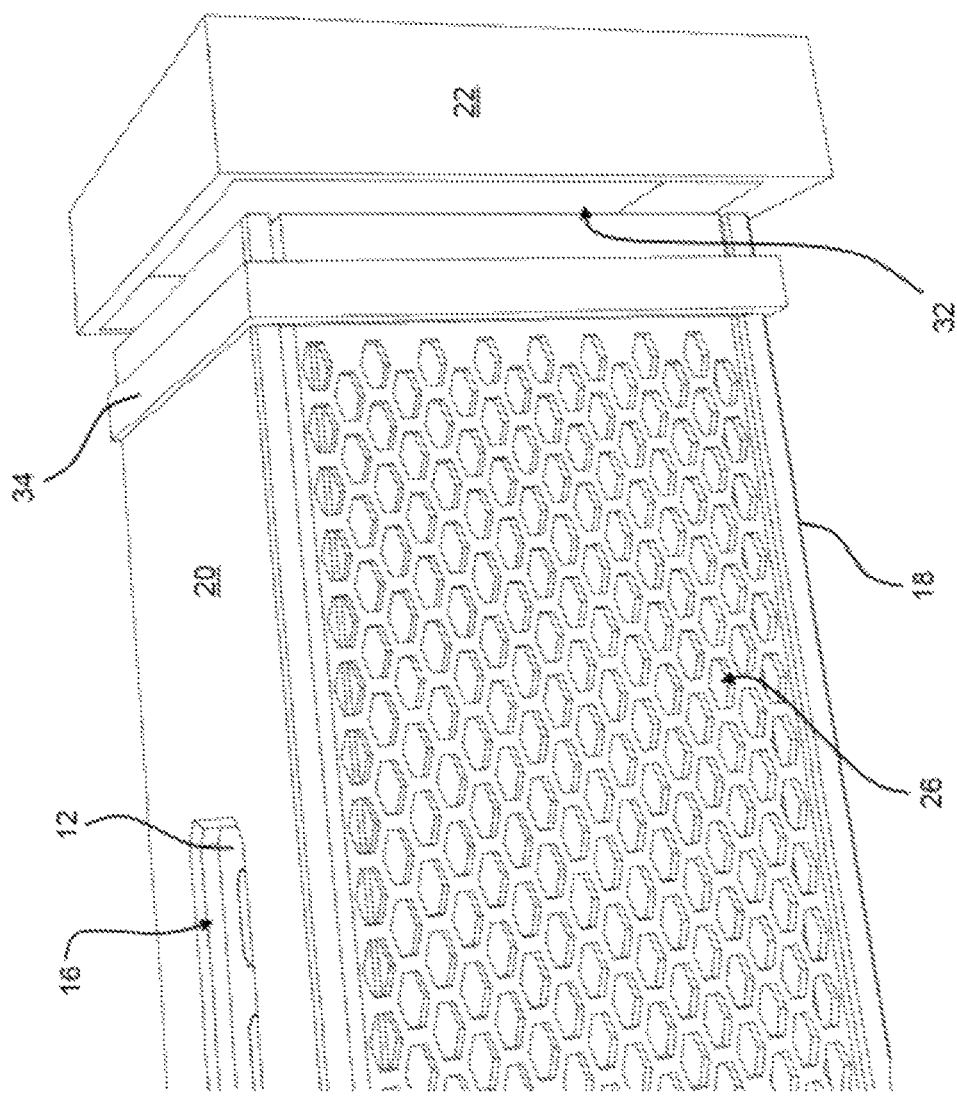
FIG. 5 illustrates a perspective view of the right side of the product with the first portion, second portion installed thereon, a retainer, and an end portion prepared for installation.

Referring to FIG. 5, in an instance where the connector 34 is separate from the end cap 22, the connector 34 is placed over the front panel 18 and enclosure 20. In the illustrated embodiment, the connector 34 forms a band around the front panel 18 and enclosure 20. With the connector 34 in place, the end cap 22 slides over the connector 34, enclosing the connector 34 and portions of the product 12, front panel 18, and enclosure 20 in the recessed area 32, While the end cap 22 is coupled to the product 12, preferably the only contact between the end cap 22 and the product 12, front panel 18 and enclosure 20 is through the connector 34 to provide an effective vibration dampening between the end cap 22 and the product 12. The end cap 22 is preferably retained on the connector 34 using a pressure fit, such that the end cap 22 is retained on the connector 34 by pressing the end cap 22 over the connector 34 and is removable by urging the end cap 22 away from the connector 34 under pressure.

Figure 6:
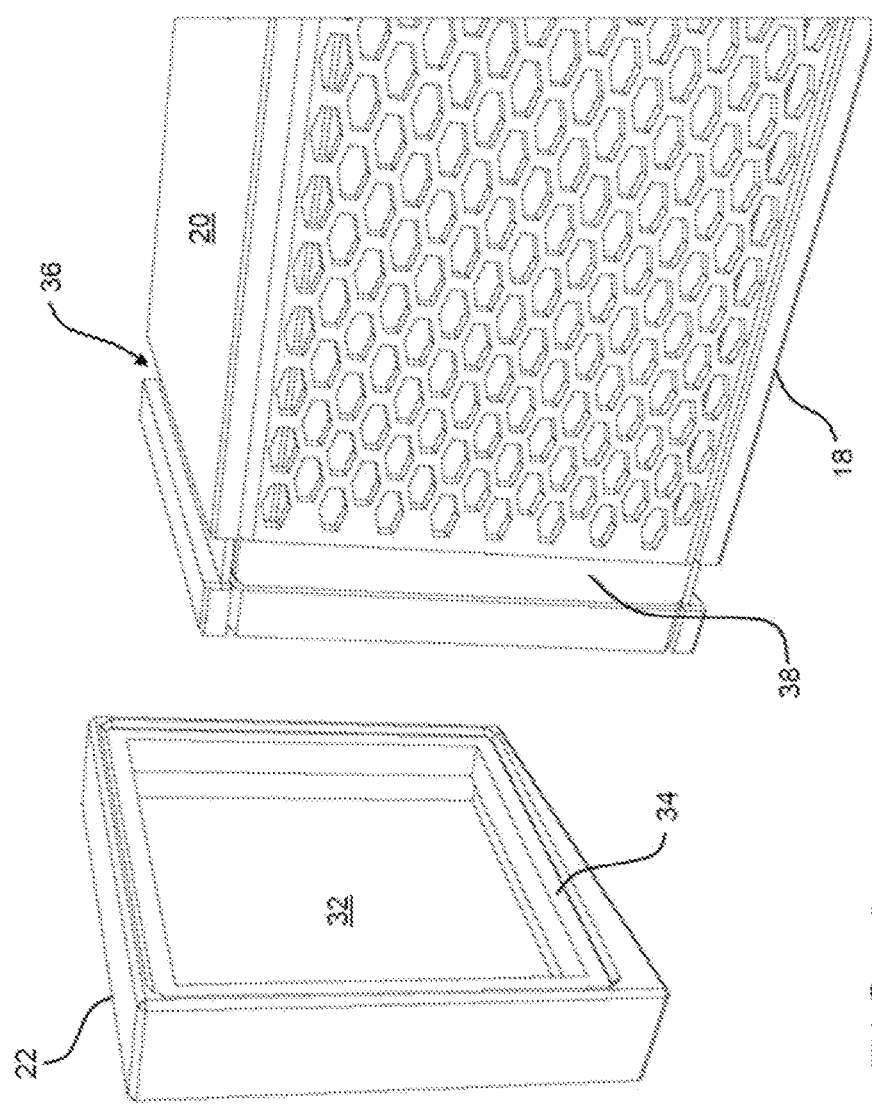
FIG. 6 illustrates a perspective view of the left side of the product and the housing with an end portion removed, revealing a retainer in the end portion.

Referring to FIG. 6 an alternative embodiment is shown wherein the connector 34 is installed in the recessed area 32 of an end cap 22. The connector is preferably affixed to the end cap, allowing the end cap 22 to be inserted over the front panel 18 and enclosure 20. The end cap 22 is held in place over the front panel 18 and enclosure 20 by virtue of the connector 24 seating in the groove 36 and the depression 38. When the connector 24 is seated in place, the end cap 22 is prevented from disengaging the front panel 18 and enclosure 20 unless pulled off under pressure.

Figure 7:
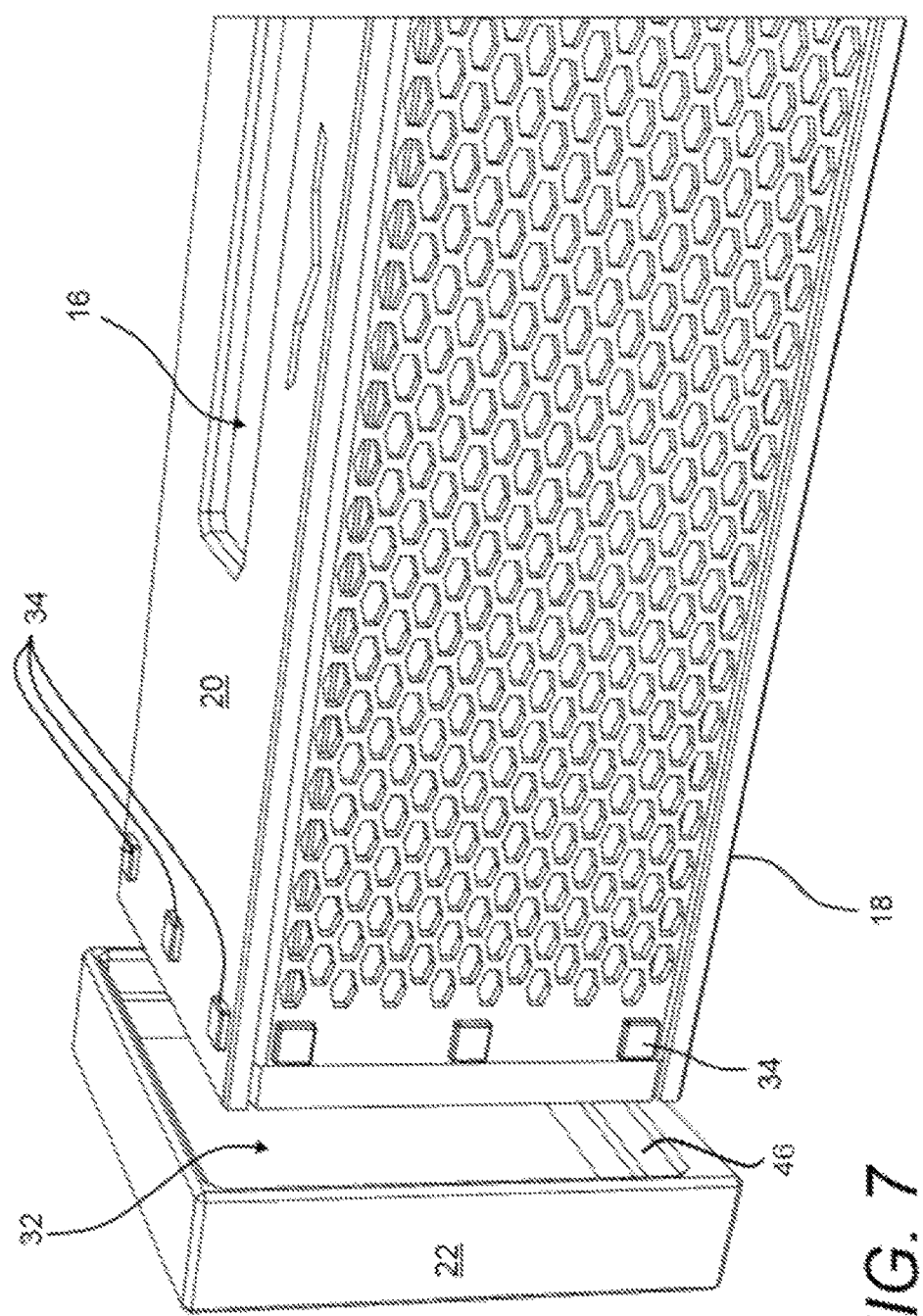
FIG. 7 illustrates a perspective view of the left side of the product and the housing with retaining stops for engaging the end portion.

Referring to FIG. 7, in certain embodiments, the connector 34 may be a series of individual connectors 34 for holding the end caps 22 against the front panel 18 and enclosure 20. In the illustrated embodiment a series of connectors 34 are affixed to the front panel 18 and affixed to the enclosure 20. Each connector 34 is sized to engage the end cap 22 and hold it under pressure against the front panel 18 and the enclosure 20. In this and similar embodiments where the connectors 34 are affixed to the front panel 18 and the enclosure 20, the end cap 22 may include a channel 46 for seating the connectors 34.

Figure 8:
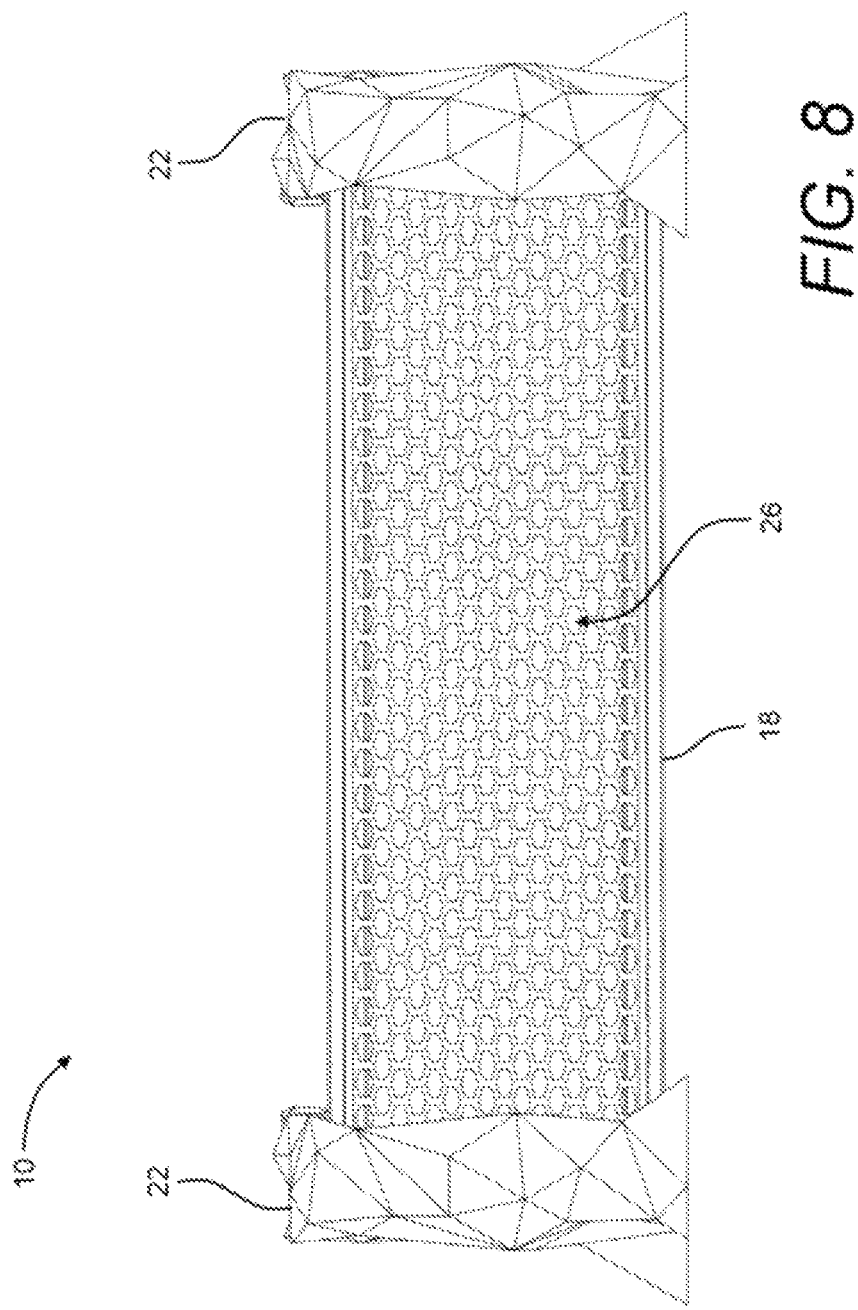
FIG. 8 illustrates a side view of a product with a customized housing having consumer re-designed end caps.

Referring to FIG. 8, the housing 10 is customizable through a computerized user interface (not shown) allowing, users to customize the shape of the end caps 22, and optionally the mesh pattern 26 of the front panel 18. In the illustrated embodiment, the end caps 22 have been rendered to be multifaceted, and the mesh 26 to have a hexagonal pattern. While the outward Shape of the end caps 22 is customizable, it is anticipated that the recessed area 32. (not shown) will remain a standard size, allowing any customized end caps 22 to be placed over the front panel 18 and the enclosure 20 (not shown). This allows a user with multiple end caps 22 having different designs to customize the housing 10 according to preference.

Figure 9:
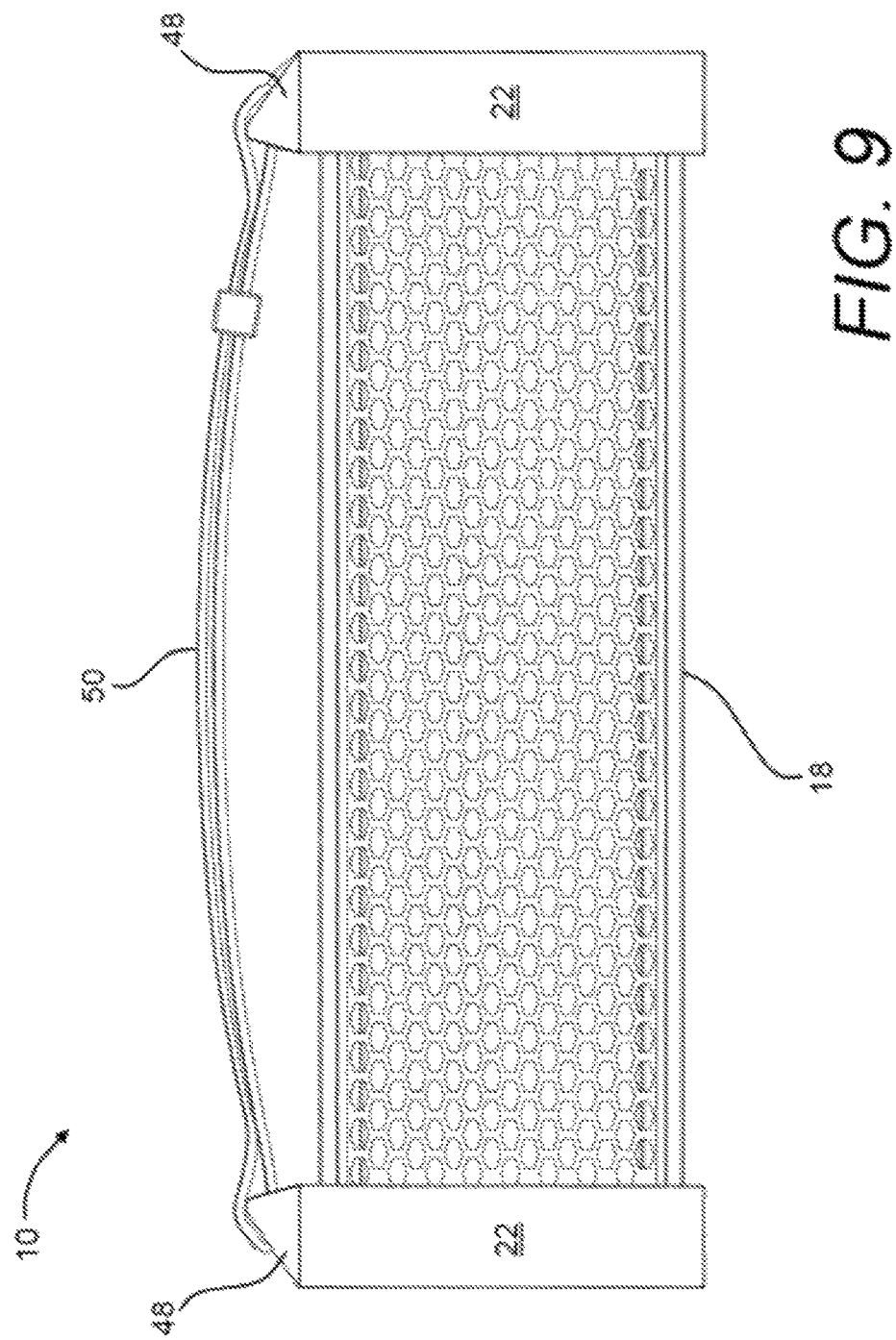
FIG. 9 illustrates a side view of a product with a customized housing having a handle spanning the end caps.

Referring to FIG. 9, in certain embodiments the housing 10 may be designed to have additional features. In the illustrated embodiment the end caps 22 appear conventional except for a raised area 48 at the top. The raised area incorporates a slot (not shown) for accommodating a handle 50 for carrying the housing 10, and thereby the product 12 (not shown). Although lifting the housing 10 by the handle 50 tends to draw the raised areas 48 together, the resilient pressure fit of the end caps 22 against the front panel 18 and enclosure 20 (not shown) by virtue of die connector 34 (not shown) ensures that the end caps 22 remain securely anchored in place.

Figure 10:
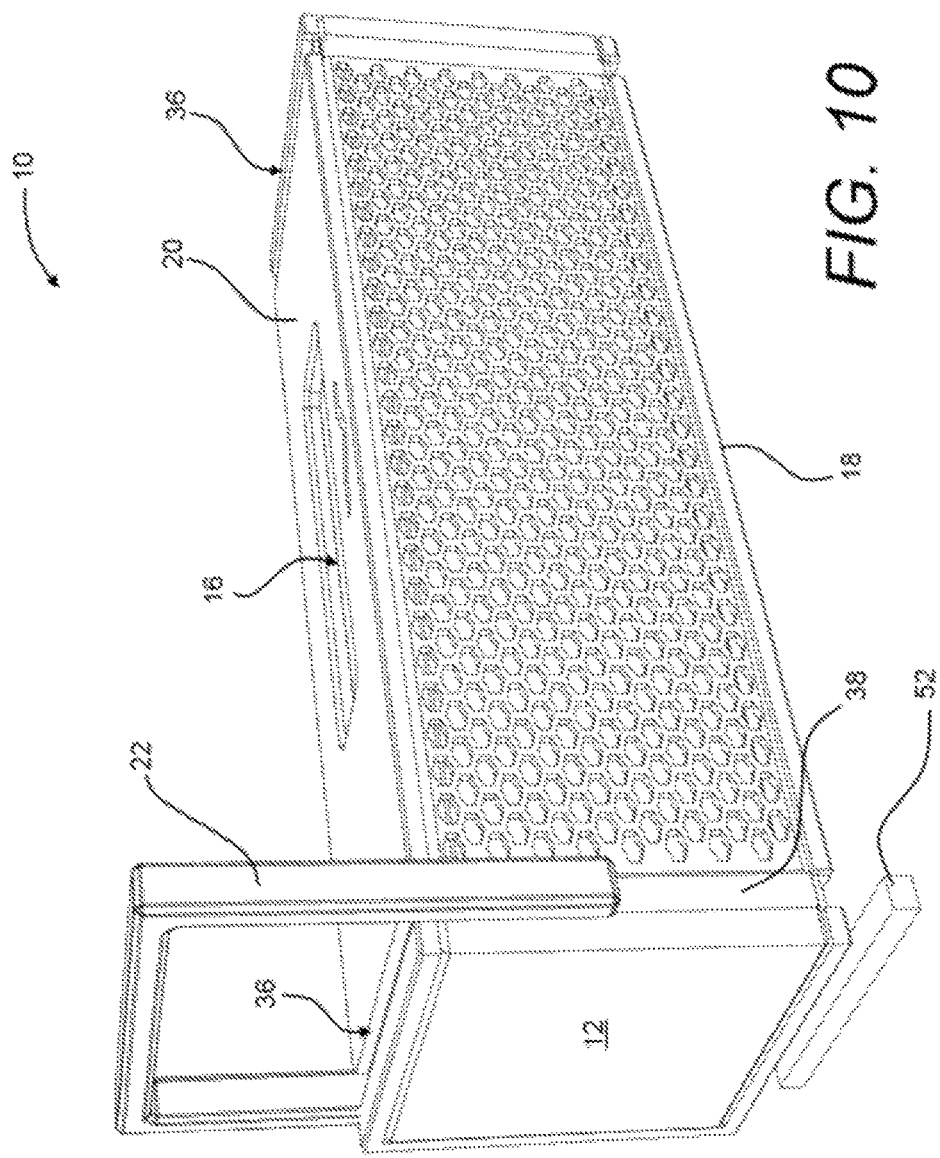
FIG. 10 illustrates a perspective view of the product and customized housing and an end cap in the form of a C bracket.

Referring to FIG. 10, it may be advantageous, or preferred by a user to have portions of the product 12 that would ordinarily be covered by the end caps 22 visible. In such instances, a modified end cap 22 may be used. In the illustrated embodiment, the end cap 22 is three-sided and sized to fit along the groove 36 and depression 38 to anchor the end cap 22 in position. For further anchorage, and to provide a fool for raising the product 12 above a surface, the end caps 22 preferably include a clip 52 for completing the end cap 22. In the illustrated embodiment the clip 52 is shown at the bottom of the end cap 22.

Figure 11:
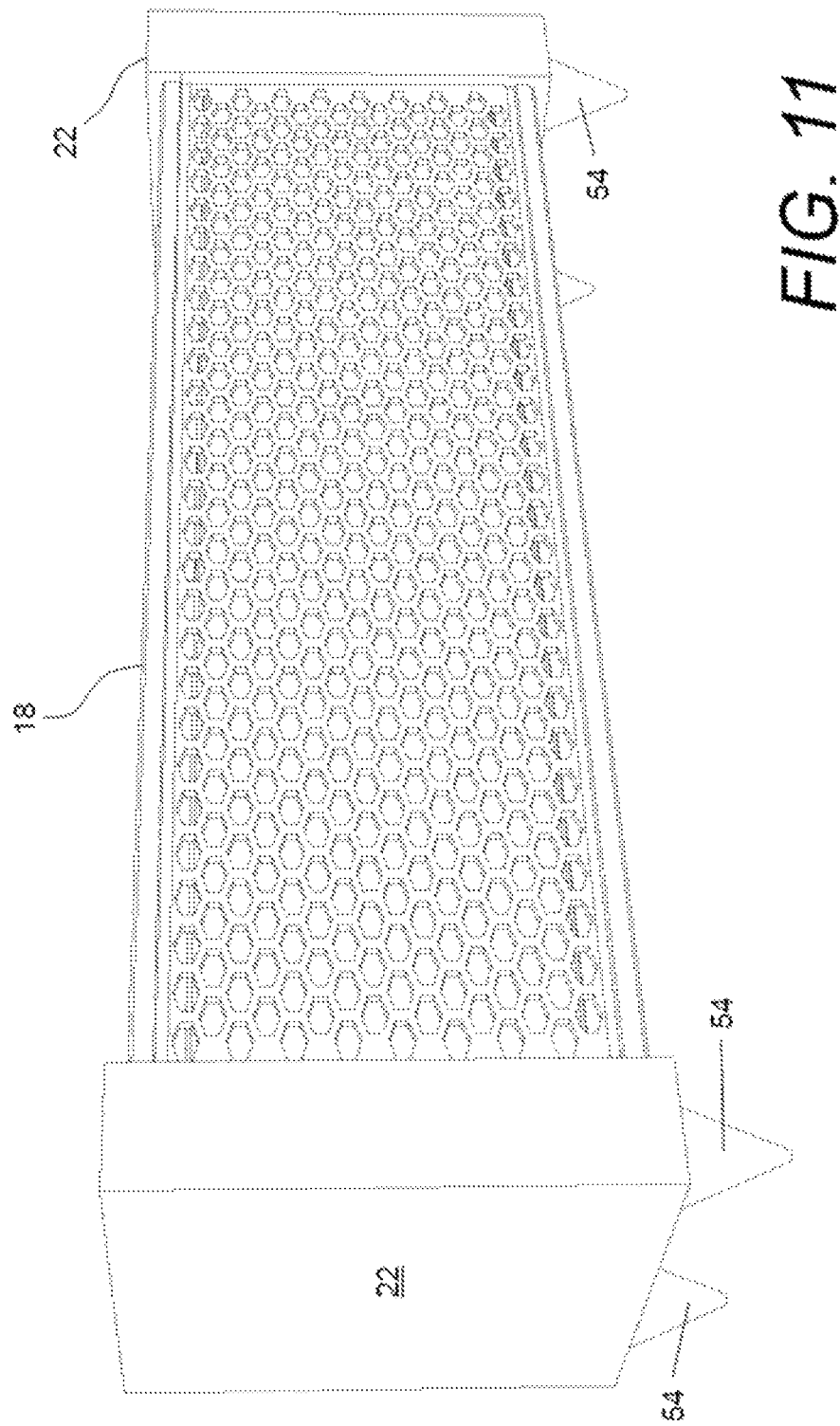
FIG. 11 illustrates a perspective view of the product and customized housing having end caps with vibration dampening feet.

Referring to FIG. 11, in embodiments where the product 12 (not shown) is a speaker, vibration dampening is of great importance. Since the end caps 22 are customizable, they may be formed with vibration dampening feet 54 for resting on a surface (not shown). The feet 54 are preferably conical to decrease vibration transmission onto the surface. Operating in combination with the connector 34 coupling the end caps 22 to the product 12 (not shown), substantial vibration isolation can be achieved. In instances where audio having high bass levels is played, a user may wish to remove end caps 22 of an alternative design, replacing them with the end caps 22 having vibration dampening feet.

Figure 12:
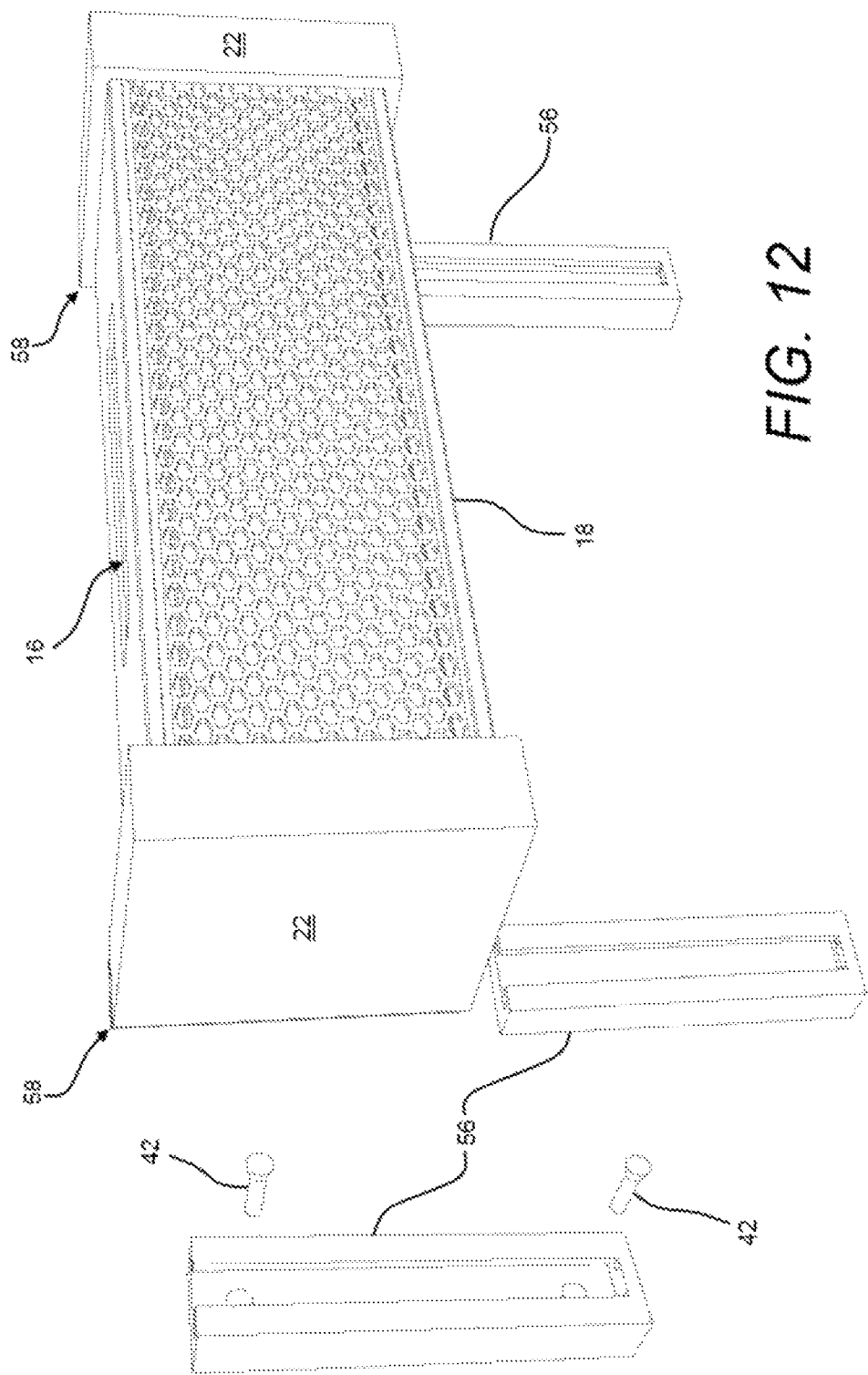
FIG. 12 illustrates an exploded view of the housing and brackets for affixing the housing to a vertical surface.

Referring to FIG. 12, it may be desirable to mount the product 12 (not shown) on a wall (not shown) or similar surface. In such an embodiment, a series of brackets 56 may be provided, attachable to the wall with fasteners 42. The end caps 22 will are ideally formed with sliding fixtures 58 on one side, allowing them to slide in and out of the brackets 56 as desired, In such an embodiment, the end caps are coupled to the product 12 using the same connector 34 (not shown) arrangement, whereby the end caps 22 surround portions of the front panel 18 and the enclosure 20 (not shown)

Figure 13:
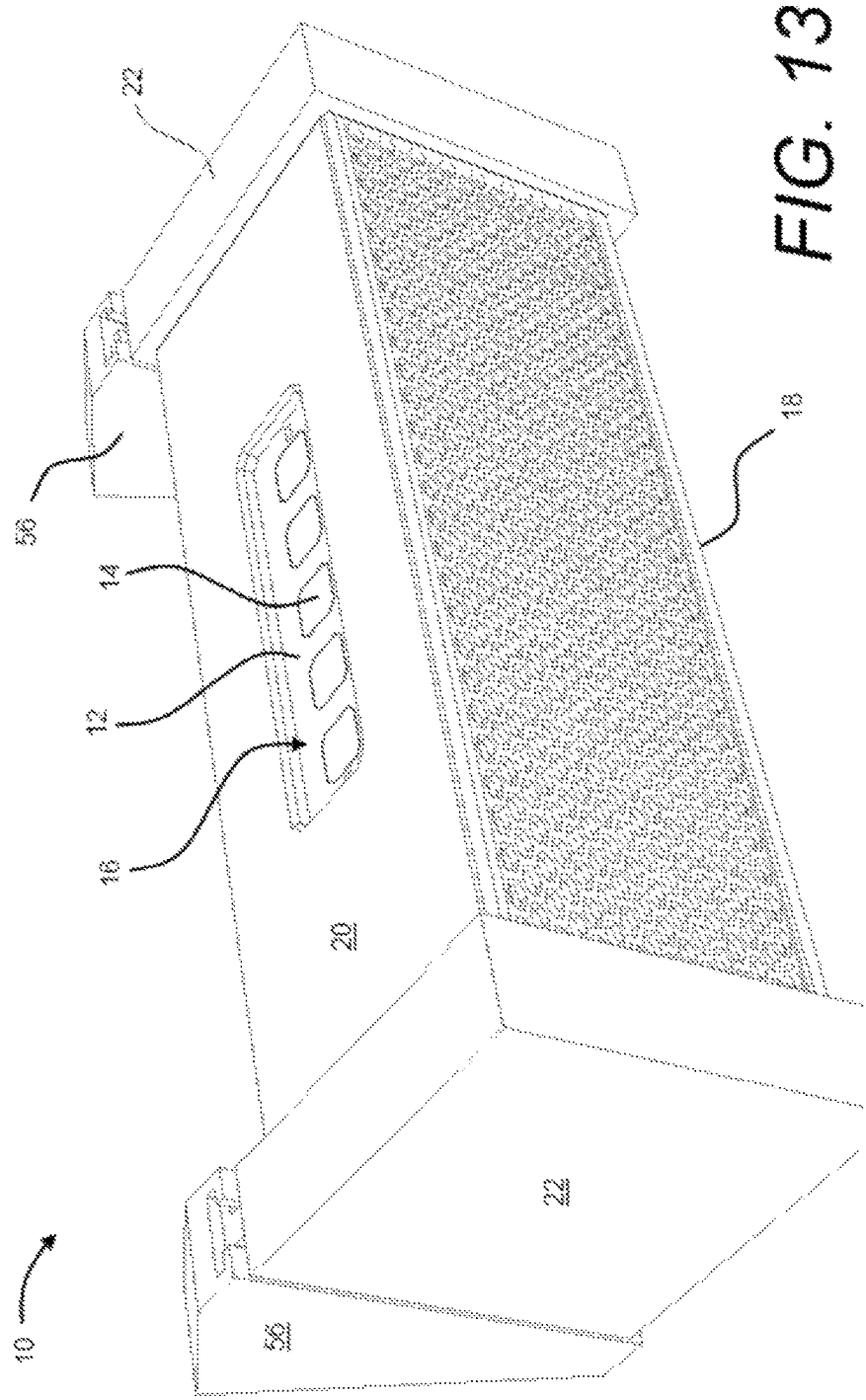
FIG. 13 illustrates a view of the housing affixed to brackets, disposing the housing at an angle.

Referring to FIG. 13, in some cases, the product 12 is best presented at an angle to a surface (not shown. In such instances, brackets 56 may be provided that hold the housing 10 at an angle relative to the surface. The attachment is preferably a sliding attachment between the brackets 56 and the end caps 44, which hold the front panel 18 and enclosure 20 together around the product 12.

Figure 14:
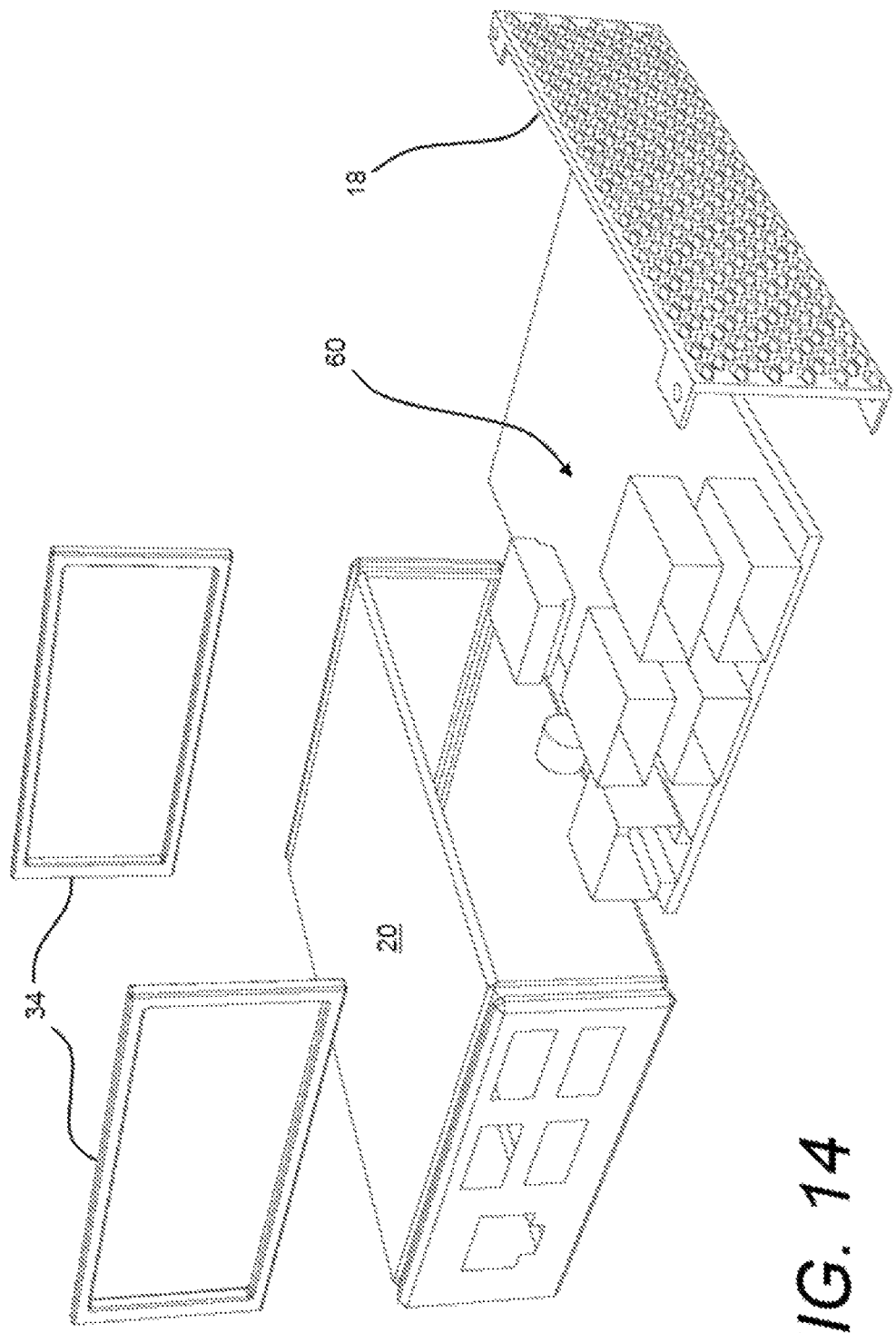
FIG. 14 illustrates an exploded view of an alternative embodiment housing for surrounding a USB hub.

Referring to FIGS. 14 and 15, the housing 10 may be used to hold and customize other electronic products 12, such as a communications hub, or other standalone product. In the embodiment illustrated in FIG. 14, a USB hub is shown in exploded view. In this view the enclosure 20 forms the main enclosure for the USB hub components 60. In this embodiment, the end caps 22 are omitted and the connector 34 is used to hold the front panel 18 and enclosure 20 together around the components 60. The enclosure includes sidewalls 62 that align with the components. FIG. 15 shows the USB hub housing 10 in an assembled state.

To make the customizable product housing 10, a user engages an interactive user interlace not shown), such as a customization website or similar interface. On the customization website the user selects the housing 10, and assigns a preferred design to the end caps 22 and optionally to the front panel 18. The design may be of the user's own creation, using features on the interactive interface, or may be chosen from among a series of pre-made customized designs. Once the design is created or selected, the end caps 22, front panel 18, and enclosure 20 for the housing are made according to the user's preference. Preferably, the end caps 22, front panel 18, and enclosure 20 retain inner dimensions for receiving the product 12, while being made with the preferred customized outer dimensions indicated by the user.

To use the customizable product housing 10, a user places the enclosure 20 around a product 12, thereby covering the top back and bottom of the product 12. The user then affixes the front panel 18 to the front of the product 12. Optionally, the user may then affix the front panel 18, enclosure 20 and product 12 together using a fastener 42. With the front panel 18 and enclosure 20 substantially surrounding the product 12, the user then presses end caps 22 on either end of the product. The connector 34 engages the front panel 18 and enclosure 20 in the process, preferably seating in the groove 36 and depression 38 and holding the end caps 22 on the front panel 18 and enclosure 20. Alternatively, the user may install the connector 34 on the front panel 18 and the enclosure 20 and then slide the end caps 22 over the connector 34. In such an arrangement, the connector 24 will preferably seat in a channel 46 within the recessed area 32 of the end caps 22. The user may then operate the product 12.

To remove the housing, or replace the housing with a different customized housing, the user simply pulls the end caps 22 from the front panel 18 and enclosure 20 under pressure, and replaces the end caps 22 with end caps 22 of a different design. Alternatively, the user may also remove the front panel 18 and replace the front panel 18 with a front panel 18 of a different design. With the new end caps 22 affixed in place, the product 12 may be used or stored according to preference.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A customizable housing for a speaker having operational components and operational controls, the housing comprising:
    opposing end caps, each end cap having a cavity;
    a customizable cover sized to slide onto the speaker, the customizable cover and speaker extending into the cavity of each end cap;
    a resilient interference fit vibration dampening buffer coupling the end caps to the cover with the cover disposed over the speaker;
    the buffer configured to hold the end caps away from the cover when the end caps are urged onto the cover; and
    wherein the buffer affixes the cover to the speaker when the end caps are pulled from the cover, and wherein the operational controls are accessible through the cover.

2. A method of customizing a speaker to have a user-defined ornamental outer housing, the method comprising the steps of:
    creating providing a custom cover shaped to partially enclose the speaker;
    creating providing a custom first end cap shaped to at least partially enclose the cover;
    creating providing a custom second end cap shaped to at least partially enclose the cover;
    creating providing a buffer for securing the speaker within the cover;
    sliding the speaker into the cover;
    placing the buffer around the cover and the speaker;
    sliding the first end cap over the cover and speaker;
    sliding the second end cap over the cover and speaker in a manner such that the second end cap faces the first end cap;
    placing the buffer around the cover and the front panel, and
    operating the speaker.

3. The method of claim 2 including the step of creating providing a custom front panel.

4. The method of claim 3 including the step of placing the front panel over the speaker and adjoining the cover.

* * * * *